(12) United States Patent
Lassl et al.

(10) Patent No.: US 11,365,969 B2
(45) Date of Patent: Jun. 21, 2022

(54) MEMS DEVICE INCLUDING SPURIOUS MODE SUPPRESSION AND CORRESPONDING OPERATING METHOD

(71) Applicant: Robert Bosch GmbH, Stuttgart (DE)

(72) Inventors: Andreas Lassl, Korntal-Muenchingen (DE); Matthias Kuehnel, Boeblingen (DE); Niels Bode, Stuttgart (DE); Nils Felix Kuhlmann, Ehningen (DE); Peter Degenfeld-Schonburg, Renningen (DE); Reinhard Neul, Stuttgart (DE); Frank Schatz, Kornwestheim (DE)

(73) Assignee: Robert Bosch GmbH, Stuttgart (DE)

( * ) Notice: Subject to any disclaimer, the term of this patent is extended or adjusted under 35 U.S.C. 154(b) by 300 days.

(21) Appl. No.: 16/645,268

(22) PCT Filed: Sep. 20, 2018

(86) PCT No.: PCT/EP2018/075431
§ 371 (c)(1),
(2) Date: Mar. 6, 2020

(87) PCT Pub. No.: WO2019/063399
PCT Pub. Date: Apr. 4, 2019

(65) Prior Publication Data
US 2020/0284583 A1 Sep. 10, 2020

(30) Foreign Application Priority Data
Sep. 26, 2017 (DE) .......................... 102017217009.3

(51) Int. Cl.
*G01C 19/5733* (2012.01)
*G02B 26/08* (2006.01)
(Continued)

(52) U.S. Cl.
CPC ..... *G01C 19/5733* (2013.01); *G02B 26/0841* (2013.01); *H03H 9/02433* (2013.01);
(Continued)

(58) Field of Classification Search
CPC ............ G01C 19/5733; G02B 26/0841; B81B 2201/0242; B81B 3/0045; H03H 9/02409;
(Continued)

(56) References Cited

U.S. PATENT DOCUMENTS 5,605,598 A 2/1997 Greiff
9,634,227 B1* 4/2017 Thalmayr .......... H03H 9/02338
(Continued)

FOREIGN PATENT DOCUMENTS

EP 1715580 A1 10/2006
WO 2008021144 A2 2/2008
(Continued)

OTHER PUBLICATIONS

International Search Report for PCT/EP2018/075431, dated Jan. 2, 2019.
(Continued)

*Primary Examiner* — Arnold M Kinkead
(74) *Attorney, Agent, or Firm* — Norton Rose Fulbright US LLP; Gerard Messina

(57) ABSTRACT

A MEMS device and a corresponding operating method. The MEMS device is equipped with an oscillatory micromechanical system, which is excitable in a plurality of useful modes, the oscillatory micromechanical system including at least one system component, which is excitable in at least one parasitic spurious mode by a superposition of the useful modes. An adjusting device is provided, which is configured in such a way that it counteracts the parasitic spurious mode by application of an electromagnetic interaction to the system component.

14 Claims, 3 Drawing Sheets

(51) Int. Cl.
*H03H 9/02* (2006.01)
*B81B 3/00* (2006.01)

(52) U.S. Cl.
CPC ..... *B81B 3/0045* (2013.01); *B81B 2201/0242* (2013.01); *H03H 9/02409* (2013.01); *H03H 2009/02456* (2013.01); *H03H 2009/02527* (2013.01)

(58) Field of Classification Search
CPC .......... H03H 2009/02456; H03H 2009/02527; H03H 9/02433
USPC ............. 331/116 M, 154; 333/197, 186, 187
See application file for complete search history.

(56) References Cited

U.S. PATENT DOCUMENTS

| | | |
|---|---|---|
| 2009/0140443 A1 | 6/2009 | Hohlfeld et al. |
| 2009/0294638 A1 | 12/2009 | Mohanty et al. |
| 2012/0086306 A1 | 4/2012 | Gaidarzhy et al. |
| 2016/0264401 A1 | 9/2016 | Liukku et al. |

FOREIGN PATENT DOCUMENTS

| | | |
|---|---|---|
| WO | 2009059639 A1 | 5/2009 |
| WO | 2013091939 A1 | 6/2013 |

OTHER PUBLICATIONS

Yanwei Guan et al., "Design and Vibration Sensitivity of a MEMS Tuning Fork Gyroscope With Anchored Coupling Mechanism," Microsyst Technol, 2015, pp. 247-254.

\* cited by examiner

MEMS DEVICE INCLUDING SPURIOUS MODE SUPPRESSION AND CORRESPONDING OPERATING METHOD

FIELD OF THE INVENTION

The present invention relates to a MEMS device and a corresponding operating method.

BACKGROUND INFORMATION

Although arbitrary optical devices and systems are also applicable, the present invention and the underlying problem thereof are explained on the basis of micromechanical rotation rate sensor devices.

For some time, rotation rate sensors (gyroscopes) including oscillatory micromechanical structures have been used in the automotive field and in consumer electronics for measuring elements. In addition, such oscillatory micromechanical structures are used in the present configurations of micromirrors, which are used in microprojectors and microscanners, for example, for LIDAR.

A rotation rate sensor including two sensitive axes is discussed, for example, in WO 2009/059639 A1. A micromirror including a resonant operation is discussed, for example, in WO 2013/091939 A1.

These and similar applications use the oscillatory micromechanical structures, which have oscillation modes (eigenmodes or useful modes), which are utilized for the intended function. The rotation rate sensors use, for example, drive modes to set detection structures into resonant oscillations. These structures in turn detect rotation rates via the measurement of the occurring Coriolis accelerations with the aid of detection modes. Micromirrors use specific oscillation modes to deflect the micromirror as intended.

The drive of the oscillatory micromechanical structures is carried out electrostatically or piezoelectrically, however, other drives are also known, for example, electromagnetic or dynamic drives, etc.

Oscillatory micromechanical structures, as are used in the above-mentioned systems or similar systems, in principle have, in addition to the desired useful modes (for example, for drive and detection), (countably) infinite oscillation modes, however, some of which may result in undesirable, interfering effects.

Thus, rotation rate sensors again and again display undesirable properties in their offset behavior, for example, so-called offset jumps. These effects occur if, in addition to the useful modes, one or multiple further parasitic spurious modes are also excited, which may result in interferences in the detection signals due to their oscillation forms. In the case of micromirrors, it may occur, for example, that larger deflections of the micromirror are not possible under certain circumstances, since the drive energy goes into other parasitic spurious modes and excites spurious oscillations. These spurious oscillations may under certain circumstances even result in undesirable mechanical impacts or in the worst case in structural fractures.

Attempts have heretofore been made to avoid the described disadvantages in that parasitic spurious modes are prevented from being placed precisely at integer multiples of the drive frequencies in the configuration of the oscillatory micromechanical structures. The excitation of the parasitic spurious modes by harmonic waves (integer multiples) of the drive frequencies is thus avoided. In practice, however, it has to be stated that due to manufacturing tolerances, it is not possible to guarantee that the multiples of the drive frequencies remain free of parasitic spurious modes. The statistical distributions of the frequencies of the parasitic spurious modes over the manufacturing tolerances is often so broad that over the plurality of the exemplars, the resonant frequencies of parasitic spurious modes are nonetheless encountered in some exemplars and under specific circumstances in these exemplars, the parasitic spurious oscillations are excited and cause corresponding problems.

Internal resonances may also exist in the mode spectrum in every configuration. These include, for example, three-mode (three-wave) mixtures and four-mode (four-wave) mixtures. These internal resonances may be excited by nonlinearities, in particular if the oscillation frequencies of the modes meet certain mathematical relationships, which are called internal resonance conditions. For the example of a three-mode mixture, the internal resonance condition is given by $f_1+f_2 \cong f_3$, $f_1$, $f_2$, and $f_3$ denoting the resonant frequencies of the oscillation modes. The more poorly the mathematical condition is met, the more difficult it is for the excitation of parasitic modes by nonlinearities to take place. Accordingly, configuration measures may be made, which in turn may not prevent the occurrence of the parasitic spurious modes due to the manufacturing tolerances, however.

SUMMARY OF THE INVENTION

An underlying aspect of the present invention is that undesirable parasitic oscillations are counteracted with the aid of an adjusting device, which applies an electromagnetic interaction to one or multiple affected system components.

An electromagnetic interaction is understood here as the generic term for static and dynamic, electric, magnetic, or electromagnetic interactions.

The present invention creates a MEMS device as described herein and a corresponding operating method as described herein.

Refinements are the subject matter of the particular further descriptions herein.

An underlying aspect of the present invention is to provide an adjusting device in the area of the system component susceptible to spurious modes, which is configured in such a way that by applying an electromagnetic interaction to the system component, it counteracts a parasitic spurious mode to which the system component is susceptible.

According to one refinement, the adjusting device includes a DC voltage generating unit for generating a DC voltage and one or multiple electrodes, which are configured in such a way that an electrostatic field may be applied to the system component via the electrodes. Such an adjusting device is easily integratable.

According to a further refinement, the DC voltage generating unit is controllable, regulatable, or settable. This may increase the accuracy in the case of nonlinearities.

According to a further refinement, the adjusting device includes an AC voltage generating unit for generating an AC voltage and one or multiple electrodes, which are configured in such a way that an electrodynamic field may be applied to the system component via the electrodes.

According to a further refinement, the AC voltage generating unit is controllable, regulatable, or settable. This may increase the accuracy in the case of nonlinearities.

According to a further refinement, the electrodes are situated perpendicularly to an oscillation direction of the system component. The effective interaction area may thus be made large.

According to a further refinement, the electrodes are situated in parallel to an oscillation direction of the system component. The distance may thus be selected to be small.

According to a further refinement, the system component includes one or multiple counter electrodes which interact with the electrodes.

According to a further refinement, the counter electrodes are molded at the system component. Additional electrode area may thus be formed on the system component.

According to a further refinement, the counter electrodes are applied as a coating to the system component.

According to a further refinement, the system component is a spring unit or a bar unit.

According to a further refinement, the DC voltage generating unit and/or the AC voltage generating unit are controllable proportionally to an oscillation deflection or oscillation speed of the system component. Effective feedback may thus be established.

Further features and advantages of the present invention are explained hereafter on the basis of specific embodiments with reference to the figures.

In the figures, identical reference numerals identify identical or functionally-identical elements.

DETAILED DESCRIPTION

Figure 1:
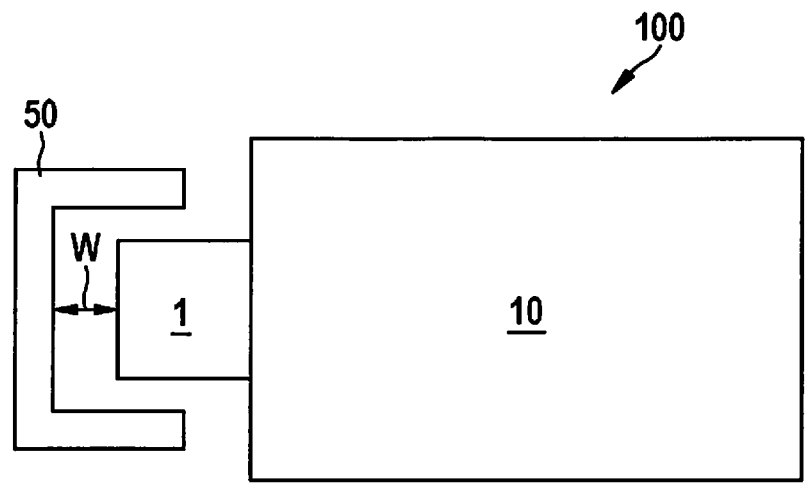
FIG. 1 shows a schematic view to explain the underlying functional principle of the present invention.

FIG. 1 shows a schematic view to explain the underlying functional principle of the present invention.

In FIG. 1, reference numeral 100 generally identifies an oscillatory micromechanical system, which may be excited in a plurality of useful modes, for example, a rotation rate sensor or a micromirror, oscillatory micromechanical system 100 including a functional block 10 and a system component 1. System component 1 is, for example, an insulated element, e.g., a spring or a bar or a combination of multiple components of functional block 10.

An adjusting device 50 is provided in the area of system component 1, which is configured in such a way that by applying an electromagnetic interaction W to system component 1, it counteracts a parasitic spurious mode to which system component 1 is susceptible.

Adjusting device 50 may be, as already mentioned above, electrostatic, electrodynamic, magnetostatic, magnetodynamic, electromagnetostatic, or electromagnetodynamic, or also piezoelectric, inter alia. In the specific embodiments described hereafter, only an electrostatic and an electrodynamic interaction are described as the electromagnetic interaction to simplify the description.

Adjusting device 50 may either be preprogrammed or be controllable or regulatable.

Figure 2A:
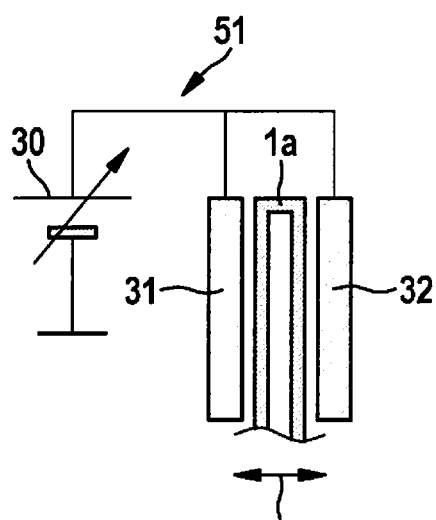
FIGS. 2a) and 2b) show schematic partial cross-sectional views of a MEMS device according to a first specific embodiment of the present invention.

FIGS. 2a), b) show schematic partial cross-sectional views of a MEMS device according to a first specific embodiment of the present invention.

In FIGS. 2a), b), reference numeral 1a identifies a system component of oscillatory micromechanical system 100 according to FIG. 1, for example, a micromechanical spring. SR identifies the oscillation direction in which system component 1a is excitable.

A first electrode 31 and a second electrode 32 are provided in their plate plane perpendicular to oscillation direction SR on opposing sides adjacent to system component 1a.

Furthermore, a DC voltage generating unit 30 is provided for generating a DC voltage, which is connected to electrodes 31, 32 in such a way that an electrostatic field may be applied to system component 1a via electrodes 31, 32. DC voltage generating unit 30 may be settable or controllable or regulatable, as schematically shown by the arrow. However, this is not necessarily required, but rather is to be considered optional.

DC voltage generating unit 30 and the two electrodes 31, 32 form adjusting device 51 in this first specific embodiment.

Figure 2B:
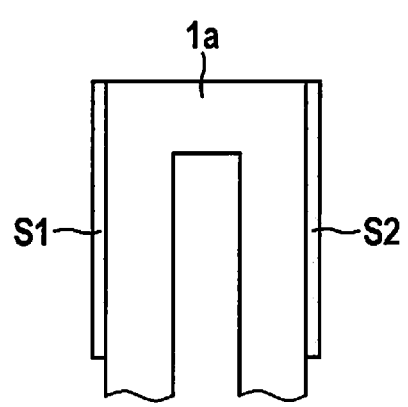

As shown in FIG. 2b), counter electrodes S1, S2 are provided as a coating on the surface of system component 1a opposite to the two electrodes 31, 32. These counter electrodes S1, S2 may either be set to a predetermined potential by an electrical connection (not shown) or operated floating. If system component 1a should itself be conductive, counter electrodes S1, S2 may also be omitted.

An adaptation of the resonant frequency of system component 1a is carried out during operation by adjusting device 51, whereby the influence of the parasitic spurious modes is eliminated or strongly reduced. In particular, the rigidity of system component 1a becomes less due to the electrostatic interaction and the resulting resonant frequency becomes smaller. It may be set in such a way that the resonant frequency is no longer at a multiple of the drive frequency or does not meet the internal resonance condition, due to which excitation to spurious oscillations cannot take place.

Figure 3:
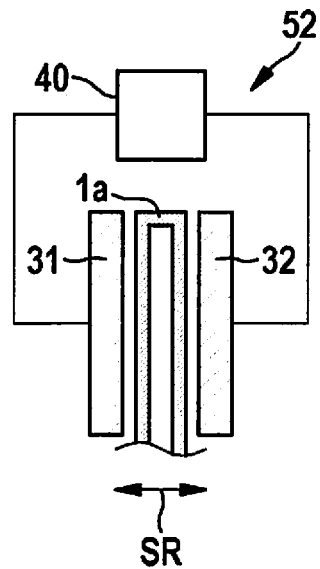
FIG. 3 shows a schematic partial cross-sectional view of a MEMS device according to a second specific embodiment of the present invention.

FIG. 3 shows a schematic partial cross-sectional view of a MEMS device according to a second specific embodiment of the present invention.

In the second specific embodiment according to FIG. 3, instead of DC voltage generating unit 30, an AC voltage generating unit 40 is provided for generating an AC voltage at electrodes 31, 32, which are configured in such a way that an electrodynamic field may be applied to system component 1a via electrodes 31, 32.

As in the first specific embodiment, AC voltage generating unit 40 changes the rigidity of system component 1a in the form of the spring, in order to shift the resonant frequency to eliminate the spurious mode.

The AC voltage generating unit 40 may optionally be settable or controllable or regulatable, but may also be set to a constant value established empirically or by simulation.

AC voltage generating unit 40 and the two electrodes 31, 32 form adjusting device 52 in this example.

Furthermore, it is possible both in the first and in the second specific embodiment and also in the specific embodiments described hereafter to configure DC voltage generating unit 30 or AC voltage generating unit 40 to be regulatable in such a way that the applied DC voltage or AC voltage, respectively, is proportional to the deflection or proportional to the speed of the spurious parasitic oscillations of system component 1a. Further electrodes (not shown) for detecting the deflection or speed may be provided for this purpose.

Figure 4:
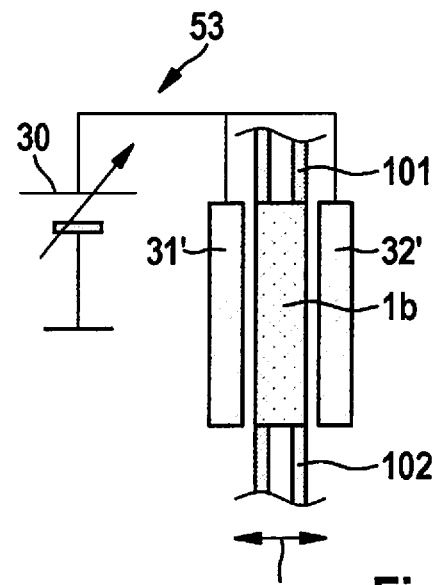
FIG. 4 shows a schematic partial cross-sectional view of a MEMS device according to a third specific embodiment of the present invention.

FIG. 4 shows a schematic partial cross-sectional view of a MEMS device according to a third specific embodiment of the present invention.

In the third specific embodiment, system component 1b is a bar, which is connected via springs 101, 102 to remaining oscillatory micromechanical system 100 according to FIG. 1. The electrodes are identified here by reference numerals 31', 32' and corresponding counter electrodes (not shown) may also be provided on system component 1b. In the third specific embodiment, adjusting device 53 again contains a DC voltage generating unit 30, as already described above.

Figure 5:
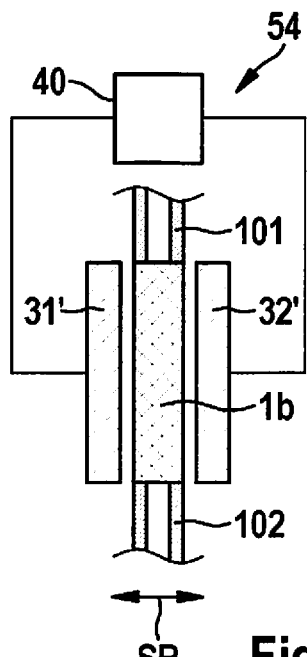
FIG. 5 shows a schematic partial cross-sectional view of a MEMS device according to a fourth specific embodiment of the present invention.

FIG. 5 shows a schematic partial cross-sectional view of a MEMS device according to a fourth specific embodiment of the present invention.

In the fourth specific embodiment, in contrast to the third specific embodiment, an analog AC voltage generating unit 40 is provided as part of adjusting device 54 as in the second specific embodiment. Otherwise, the fourth specific embodiment corresponds to the third specific embodiment.

Figure 6:
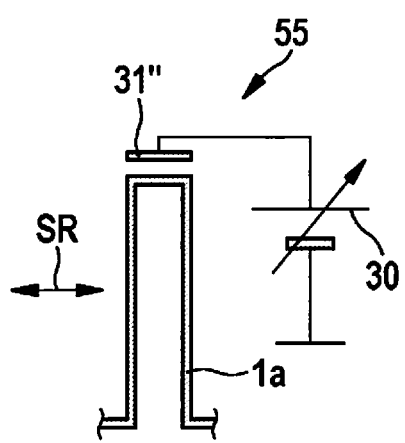
FIG. 6 shows a schematic partial cross-sectional view of a MEMS device according to a fifth specific embodiment of the present invention.

FIG. 6 shows a schematic partial cross-sectional view of a MEMS device according to a fifth specific embodiment of the present invention.

According to FIG. 6, system component 1a is again a spring, however, an electrode 31" is provided with its plate plane parallel to oscillation direction SR at the free end of the spring, whereby the electrostatic field of DC voltage generating unit 30 acts perpendicularly to oscillation direction SR.

In the fifth specific embodiment, adjusting device 55 is formed by DC voltage generating unit 30 and electrode 31".

In this fifth specific embodiment, it is advantageous that in the case of the arrangement in parallel to oscillation direction SR of system component 1a (in the form of the spring), the distance to system component 1a may be small in relation to the above specific embodiments, which results in a strong electrostatic attractive force.

In the fifth specific embodiment, the distance may thus be selected to be smaller. If the attractive force is nonetheless not sufficient in the fifth specific embodiment, it may be increased by a counter electrode which is also moved, as described hereafter.

Figure 7:
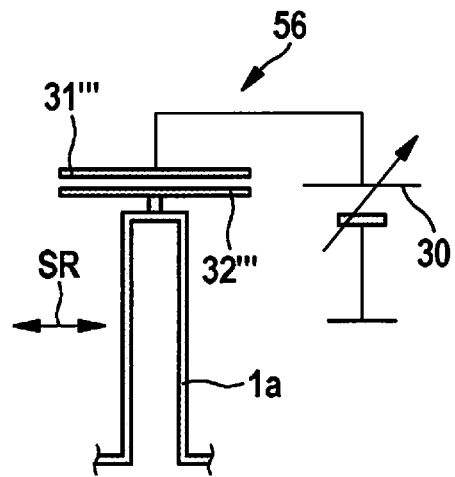
FIG. 7 shows a schematic partial cross-sectional view of a MEMS device according to a sixth specific embodiment of the present invention.

FIG. 7 shows a schematic partial cross-sectional view of a MEMS device according to a sixth specific embodiment of the present invention.

In FIG. 7, reference numeral 31''' identifies an electrode which is connected to DC voltage generating unit 30. A counter electrode 32''' molded at system component 1a may be configured to be enlarged in comparison to the fifth specific embodiment, so that the attractive force is increased.

In the sixth specific embodiment, adjusting device 56 is formed by the DC voltage generating unit and electrodes 31''', 32'''.

Otherwise, the structure of the sixth specific embodiment is identical to that of the fifth specific embodiment.

Although the present invention was described on the basis of exemplary embodiments, it is not restricted thereto. In particular, the mentioned materials and topologies are only by way of example and are not restricted to the explained examples.

As already mentioned above, in addition to electrostatic and electrodynamic interaction, other electromagnetic interactions may also be used, for example, piezoelectric layers or magnetic layers or current-conducting conductors being applied to corresponding system components of the oscillatory micromechanical structure.

The present invention is also not restricted to the system components shown, but rather is applicable to any arbitrary one-piece or multipart system components.

The ascertainment of the spurious resonances to be eliminated may be carried out either empirically in a calibration mode or by a corresponding simulation.

The present invention is also applicable not only to rotation rate sensors or micromirrors, but rather to any arbitrary oscillatory micromechanical systems.

What is claimed is:

1. A MEMS device, comprising:
    an oscillatory micromechanical system, which is excitable in a plurality of useful modes, wherein the oscillatory micromechanical system includes at least one system component, which is excitable in at least one parasitic spurious mode by superposing the useful modes; and
    an adjusting device, which is configured so that it counteracts the superposition with the parasitic spurious mode by application of an electromagnetic interaction to the system component;
    wherein the adjusting device includes a DC voltage generating unit for generating a DC voltage and at least one or more electrodes, which is configured so that an electrostatic field is applied to the system component via the electrodes.

2. The MEMS device of claim 1, wherein the DC voltage generating unit is controllable.

3. A MEMS device, comprising:
    an oscillatory micromechanical system, which is excitable in a plurality of useful modes, wherein the oscillatory micromechanical system includes at least one system component, which is excitable in at least one parasitic spurious mode by superposing the useful modes; and
    an adjusting device, which is configured so that it counteracts the superposition with the parasitic spurious mode by application of an electromagnetic interaction to the system component;
    wherein the adjusting device includes an AC voltage generating unit for generating an AC voltage and one or multiple electrodes, which are configured so that an electrodynamic field may be applied to the system component via the electrodes.

4. The MEMS device of claim 3, wherein the AC voltage generating unit is controllable.

5. The MEMS device of claim 1, wherein the one or more electrodes are situated perpendicularly to an oscillation direction of the system component.

6. The MEMS device of claim 1, wherein the one or more electrodes are situated in parallel to an oscillation direction of the system component.

7. The MEMS device of claim 1, wherein the system component includes one or more counter electrodes, which interact with the one or more electrodes.

8. The MEMS device of claim 3, wherein the counter electrodes are molded at the system component.

9. The MEMS device of claim 3, wherein the counter electrodes are applied as a coating to the system component.

10. A MEMS device, comprising:
    an oscillatory micromechanical system, which is excitable in a plurality of useful modes, wherein the oscillatory micromechanical system includes at least one system component, which is excitable in at least one parasitic spurious mode by superposing the useful modes; and an adjusting device, which is configured so that it counteracts the superposition with the parasitic spurious mode by application of an electromagnetic interaction to the system component;

wherein the system component includes a spring unit or a bar unit.

11. The MEMS device of claim 2, wherein the DC voltage generating unit and/or the AC voltage generating unit are controllable proportionally to an oscillation deflection or oscillation speed of the system component.

12. An operating method for a MEMS device, which includes an oscillatory micromechanical system, the method comprising:

exciting the oscillatory micromechanical system in a plurality of useful modes, wherein the oscillatory micromechanical system includes at least one system component, which is excitable in at least one parasitic spurious mode by superposing the useful modes;

setting a resonant frequency of the system component with an adjusting device, which is configured so that it counteracts the superposition with at least one parasitic spurious mode by applying an electromagnetic interaction to the system component;

wherein the parasitic spurious mode is ascertained during the operation by a detection unit.

13. The operating method of claim 12, wherein the parasitic spurious mode is ascertained in a calibration mode or a simulation tool.

14. An operating method for a MEMS device, which includes an oscillatory micromechanical system, the method comprising:

exciting the oscillatory micromechanical system in a plurality of useful modes, wherein the oscillatory micromechanical system includes at least one system component, which is excitable in at least one parasitic spurious mode by superposing the useful modes;

setting a resonant frequency of the system component with an adjusting device, which is configured so that it counteracts the superposition with at least one parasitic spurious mode by applying an electromagnetic interaction to the system component;

wherein the parasitic spurious mode is ascertained during the operation by a detection unit, which includes at least one electrode or at least one piezoelectric layer, at least one piezoresistive layer, or at least one magnetic layer, or at least one current-conducting conductor on the at least one system component.

\* \* \* \* \*